United States Patent [19]

Gilbert

[11] 3,745,557

[45] July 10, 1973

[54] ANALOG-DIGITAL AND DIGITAL-ANALOG CONVERSION DEVICE AND METHOD

[75] Inventor: Roswell W. Gilbert, New York, N.Y.

[73] Assignee: Technical Management Services, Inc., Westfield, N.J.

[22] Filed: Sept. 27, 1971

[21] Appl. No.: 184,026

Related U.S. Application Data

[62] Division of Ser. No. 6,075, Jan. 27, 1970, Pat. No. 3,626,292.

[52] U.S. Cl. ...... 340/347 AD, 321/44, 340/347 DA

[51] Int. Cl. .......................... H03r 13/02, G08c 1/00

[58] Field of Search ................. 340/347 C, 347 AD; 323/48; 321/44, 46

[56] References Cited

UNITED STATES PATENTS

| | | | |
|---|---|---|---|
| 3,522,598 | 8/1970 | Sokolich | 340/347 AD |
| 3,079,598 | 2/1963 | Wald | 340/347 AD |
| 3,540,037 | 11/1970 | Ottesen | 340/347 C |
| 3,495,235 | 2/1970 | Ottesen | 340/347 AD |
| 3,349,311 | 10/1967 | Dudley | 321/44 |

*Primary Examiner*—Thomas A. Robinson
*Attorney*—Curtis, Morris & Safford

[57] ABSTRACT

The conversion of analog into digital signals and digital into analog signals is accomplished with the use of a signal transformer device which produces multiple output voltages whose values vary in accordance with a digital code. Each voltage is a precise multiple of a signal input to the transformer. In the transformer device, means are provided for repeatedly reversing the connections of the input terminals to the primary winding of a transformer, and means are provided for causing the magnetic flux in the core of the transformer to excursion symmetrically below saturation level, thus enabling operation with DC input signals. In the conversion of analog signals into digital signals, there is used a successive approximation method in which the polarity of the correction signal is made opposite to the polarity of the error in the previous approximation of the digital signal. Each correction signal forms a part of the final digital output signal.

38 Claims, 10 Drawing Figures

INVENTOR:
ROSWELL W. GILBERT
BY
Curtis, Morris & Safford
ATTORNEYS.

ANALOG-DIGITAL AND DIGITAL-ANALOG CONVERSION DEVICE AND METHOD

This is a division of application Ser. No. 6,075, filed Jan. 27, 1970, now U.S. Pat. No. 3,626,292.

This application relates to electrical signal conversion devices and methods; more particularly, this invention relates to digital and digital-to-analog conversion devices and methods.

It is another object of the present invention to provide apparatus and methods for converting analog signals into digital form and digital signals into analog form with a high degree of accuracy and reliability, and at a relatively high speed.

In accordance with the present invention, the foregoing objects are met by the provision of electrical signal conversion apparatus and methods in which the conversion of analog into digital signals and digital into analog signals is accomplished with the use of a signal transformer device which produces multiple output voltages whose values vary in accordance with a digital code. Each voltage is a precise multiple of a signal input to the transformer. In the transformer device, means are provided for repeatedly reversing the connections of the input terminals to the primary winding of a transformer, and means are provided for maintaining the magnetic flux in the core of the transformer below saturation level, thus enabling operation with DC input signals. In the conversion of analog signals into digital signals, there is used a successive approximation method in which the polarity of the correction signal is made opposite to the polarity of the error in the previous approximation of the digital signal. Each correction signal forms a part of the final digital output signal.

Further objects and advantages of the present invention will be set forth in or apparent from the following description and drawings.

ANALOG-TO-DIGITAL-CONVERSION

Figures 1, 2, 3, 4:
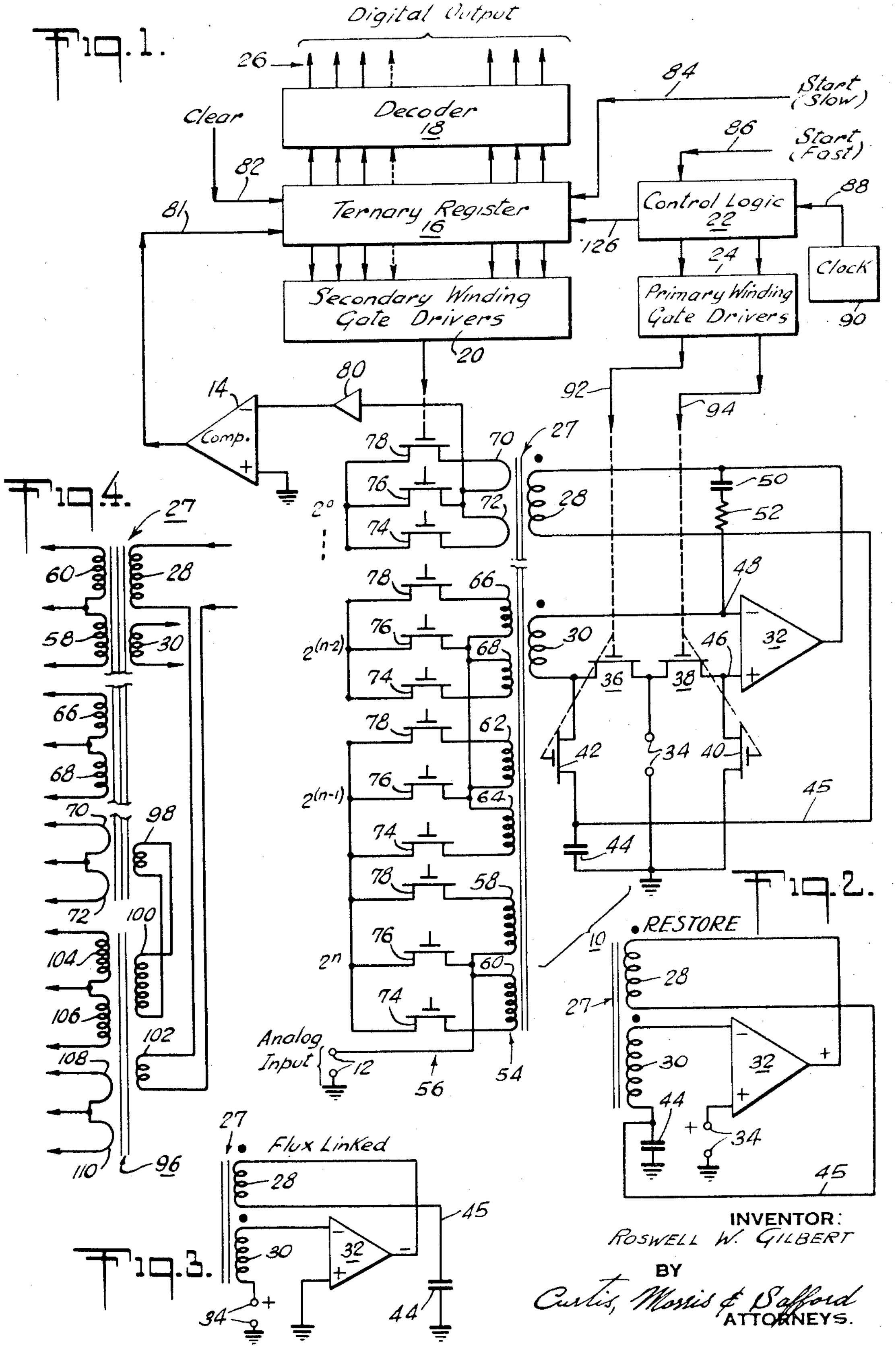
FIG. 1 is a schematic circuit diagram of one embodiment of the present invention.
FIGS. 2 and 3 are equivalent circuit diagrams for a portion of the circuit shown in FIG. 1 during different operating modes.
FIG. 4 is a schematic circuit diagram of an alternative embodiment of a portion of the device shown in FIG. 1.

FIG. 1 shows an analog-to-digital converter (hereinafter referred to as an "A/D converter") which is adapted to receive an electrical analog input signal on a pair of input terminals 12 (at the bottom of FIG. 1) and convert it into digital output signals appearing on several output leads 26 (at the top of FIG. 1). To give a prosaic example, the analog input signal might be a voltage whose magnitude is proportional to the level of gasoline in a gasoline tank. The A/D converter shown in FIG. 1 will convert such a voltage into a binary-coded digital output signal consisting of either a voltage or no voltage appearing on selected output leads 26 in a coded pattern. As is well known, the digital output signal can be used in digital computers or in other devices requiring input signals in digital rather than analog form.

The A/D converter shown in FIG. 1 includes a ratioing device 10 which provides a plurality of voltage sources, indicated generally at 54, whose voltages vary from one source to the next in accordance with a binary code progression. The voltage sources 54 are connected, together with the analog input signal, to a conventional voltage comparator 14 through a buffer amplifier 80. The polarity and timing of the connection of the individual voltage sources 54 is controlled by a plurality of switches or "gates" 56, which are controlled by circuitry to be described below. The output signal of the comparator is delivered over a lead 81 to a register 16.

The sources 54 are switched into the circuit one-at-a time. The sum of the voltages of the sources which have been switched into circuit at any given time is used as a reference signal. The comparator 14 compares the reference signal with the analog input signal and produces a logical signal whose state depends upon whether the reference signal is greater or less than the analog input signal. The register 16 detects the state of the signal from the comparator, provides an output signal depending upon the state of the comparator signal, and then actuates one of a plurality of gate driver circuits 20 which actuates one or more of the gates 56 to connect another voltage source into the circuit. The source 54 is connected with a polarity either aiding or opposing that of the analog input, depending upon the polarity of the comparator signal. This process is repeated once for each bit in the total output signal of the register 16, until the register is full.

The outputs of the register 16 are delivered to a decoder 18 which converts the ternary-form output of the register 16 into a binary-coded output signal on the leads 26, together with a "polarity bit" signal indicating the polarity of the output.

The operation of the device is initiated by a "start" signal supplied over a lead 84 to the ternary register 16, for operation in a relatively slow mode, or over a lead 86 for relatively fast operation. The stepping of the register 16 is controlled by a control logic circuit 22 which is supplied with timed signals over a lead 88 from a clock signal source 90. The register 16 can be cleared by means of a "clear" signal delivered over a lead 82. The construction and operation of the ratioing device 10, the register 16, the drivers 20, and the decoder 18 will be explained below in greater detail.

The system and method described above for analog-to-digital conversion are capable of providing analog-to-digital conversion at a speed which is considerably increased over comparable prior art systems. In the prior art approach which is believed to be most comparable, that commonly known as the "iterative" or "successive approximation" approach, each separate voltage source is first added to the reference voltage and, if the resulting new reference voltage is greater than the input voltage, then the source is removed from the reference voltage. However, if the resulting reference voltage is less than the analog input, then that source is allowed to remain connected in the circuit. Thus, in such prior art approaches, each source first is connected and then either left in or removed from the circuit, depending on whether the reference signal is greater than or less than the analog input signal. In the system and method of the present invention, the step of either removing or leaving each source connected is eliminated entirely, and each source, once connected, remains connected during the remainder of the conversion process. This makes it possible to cut the total conversion time approximately in half, since the time previously required by the withdrawal step is eliminated.

RATIOING DEVICE

The ratioing device 10 shown in FIG. 1 comprises a transformer which includes a core 27, a primary "drive" winding 28, a "sense" winding 30 and a plurality of secondary windings 58, 60, etc., which form the voltage sources 54.

The secondary windings are arranged in pairs; windings 58 and 60 constituting a first pair, windings 62 and 64 constituting a second pair, windings 66 and 68 constituting a third pair, and windings 70 and 72 constituting a last pair. Only four such pairs are shown in FIG. 1 in order to simplify the drawings. However, it should be understood that a considerably greater number of winding pairs can be provided, if needed.

The number of turns on the windings of each pair varies from one pair to the next in accordance with a binary progeression, as is indicated by the numerals to the left of each pair in FIG. 1. The number of pairs which is provided preferably is equal to the number of bits desired in the digital output signal. This number is represented in the progression by the letter *n*. The number of turns in each winding is 1 power of 2 less than the corresponding winding in the preceding pair.

As an example, if 10 bits are desired in the digital output code, there are 10 secondary winding pairs, and the number of turns on each winding in the $2^n$ pair is $2^{10}$ times the number of turns on the windings in the last pair of windings.

If there is only one turn in each of windings 70 and 72, as is shown in FIG. 1, then there are 1,024 turns on each of the windings 58 and 60. Of course, the voltage provided by each winding varies directly as the number of turns on the windings. Thus, the voltage provided by winding 58 or 60 is 1,024 times as great as that provided by winding 70 or 72. Therefore, winding 58 or 60 provides what can be termed the "most significant bit" in the digital output, and winding 70 or 72 provides what can be termed the "least significant bit" in the digital output signal.

The windings in each secondary pair are wound in opposite directions so that the polarity of the voltage added by that pair depends upon which of the windings is connected into the circuit. The gates which have been identified above as a group by the reference numeral 56 actually consist of plural sets of separate gates 74, 76 and 78, each of which determines which of the two windings in a pair is to be connected in circuit. Each of the gates 74, 76 and 78 preferably consists of a "MOS" insulated gate field effect transistor ("MOSFET") which is gated on by means which will be described below. At the start of a conversion process, each of the gates 76 is turned on, whereas each of the other gates 74 and 78 is turned off. The winding pairs are connected in series in the manner shown in FIG. 1 so that the signals from the windings are connected in series with the analog input signal when the windings are connected to the input terminals 12. During each step in the conversion process, one of the gates 74 and 78 is turned on while the gate 76 is turned off, so that one or the other of the winding pairs is connected in series with the analog input terminals, thus either adding its voltage to or subtracting its voltage from the analog input. The combination of the analog signal and the combined secondary signal is fed through an amplifier 80 to the comparator 14.

DC TRANSFORMER

The ratioing device 10 actually comprises a transformer which is capable of converting DC input signals into voltages on the secondary windings which are highly precise multiples of the DC input signals. Such a transformer, of course, has uses other than its use as a ratioing device in analog-digital converters.

Highly accurate voltage transformation has been hindered in the past by the fact that the transformer is less than perfect; that is, the transformer requires primary magnetizing current, and the flow of this current develops voltage drop in the primary winding of the transformer which creates errors in the secondary voltages of the transformer. This problem is solved in the present system by providing a primary drive winding 28 which is supplied with primary magnetizing current by a differential amplifier 32. The return of the drive winding 28 is fed back to the differential amplifier over a lead 45 and an input voltage is applied at the terminal 34. The sense winding 30 senses the flux rate-of-charge developed by the primary winding 28 in the core 27, and applies its voltage in combination with the input voltage of the differential amplifier 32. The amplifier 32 has a very high open-loop voltage gain, at least several million. Therefore, because of the negative feedback arrangement, the amplifier 32 will not permit there to be any significant difference between the voltage at input terminals 34 and the voltage on the sense winding 30, and the voltage on the sense winding 30 will be maintained very close to the input voltage (e.g., to within 1 part in 10 million). The voltage induced in the sense winding 30 determines the voltage on the secondary windings. Thus, the corresponding voltage induced in each secondary winding will be almost exactly equal to its turns ratio times the sense winding voltage; i.e., each secondary voltage will be a precise multiple of the input voltage to the transformer.

"Active" transformer primary circuits similar to that described above have been known in the past for use in transforming AC signals. However, it has not been suggested how to enable the device to operate with DC input signals. In accordance with the present invention, the device 10 is enabled to operate with DC input signals by means of a series of MOSFET switches or gates 36, 38, 40 and 42, which repeatedly reverse the connection of the input terminals 34 and thus reverse the direction of the primary drive current. Also, a storage capacitor 44 is provided for maintaining the average value of the primary drive current at zero, thus maintaining symmetry of magnetization and preventing saturation of the transformer core when operating with DC input signals, or signals having frequency components that are synchronous with the switching frequency.

The MOSFET gates are operated in sequence determined by the control logic circuit 22 which drives a series of primary winding gate drivers 24 and supplies gating signals to the gates over leads 92 and 94. The operation cycle is such that switches 36 and 40 are closed while switches 42 and 38 are open, and switches 36 and 40 are open while switches 38 and 42 are closed.

FIG. 3 shows the equivalent primary circuit which exists during the portion of the operation cycle which is named the "flux-linked" sub-cycle of operation, whereas FIG. 2 illustrates the equivalent primary circuit during the other portion of the operating cycle which is named the "restore" sub-cycle of operation.

During the flux-linked sub-cycle, the differential amplifier 32 detects the difference between the DC voltage on the input terminals 34 and the voltage on the sense winding 30, and supplies ouput magnetization current to the drive winding 28. The flow of magnetization current through the winding 28 stores charge in the capacitor 44. During this mode of operation, flux is increasingly substantially linearly in the core 27.

When the primary circuit switches to the restore sub-cycle as shown in FIG. 2, the polarity of the input terminal 34 is reversed, and the capacitor 44 now is connected in series with the terminals 34 and the sense winding 30. The flux in the core 27 now decreases linearly.

The feedback capacitor 44 assures that the time-average of the magnetization current through the primary winding will be below a level at which the core 27 would be saturated. This average value effectively is zero with continuing time.

The feedback capacitor 44 stores a voltage proportional to the magnetization current during the flux-linked sub-cycle and then adds that voltage in series with the input signal during the restore sub-cycle so as to increase the output voltage of the amplifier 32 during the restore sub-cycle and drive current in the reverse direction through the drive winding in an amount higher than it would have been but for the presence of the capacitor in the input circuit of the amplifier 32. If the flux-linked and restore sub-cycle are precisely equal in time duration, the waveform of the voltage across the feedback capacitor will be a sawtooth wave symmetrical with respect to a zero voltage axis. Each ramp, both positive and negative, of the sawtooth wave, will have the same slope. However, if the balance of the time durations of the sub-cycles changes, then the axis of the sawtooth wave changes from zero and attains some DC value sufficient so that the capacitor voltage will drive the amplifier during the restore sub-cycle sufficiently to make the time average of the current zero.

The value of the capacitor 44 is not critical, although it should be sufficient to limit the charge voltage excursion well within the output capability of the differential amplifier. A value of 1 microfarad proved to be satisfactory in the specific circuit described by the way of example herein.

Another way in which the time average of the magnetization current of the transformer can be maintained at zero is to repeatedly or continuously adjust the relative time durations of the flux-linked and restore sub-cycles of the operation so that the total average current flow during each sub-cycle equals the total average current flow during the other sub-cycle.

Figures 5, 6:
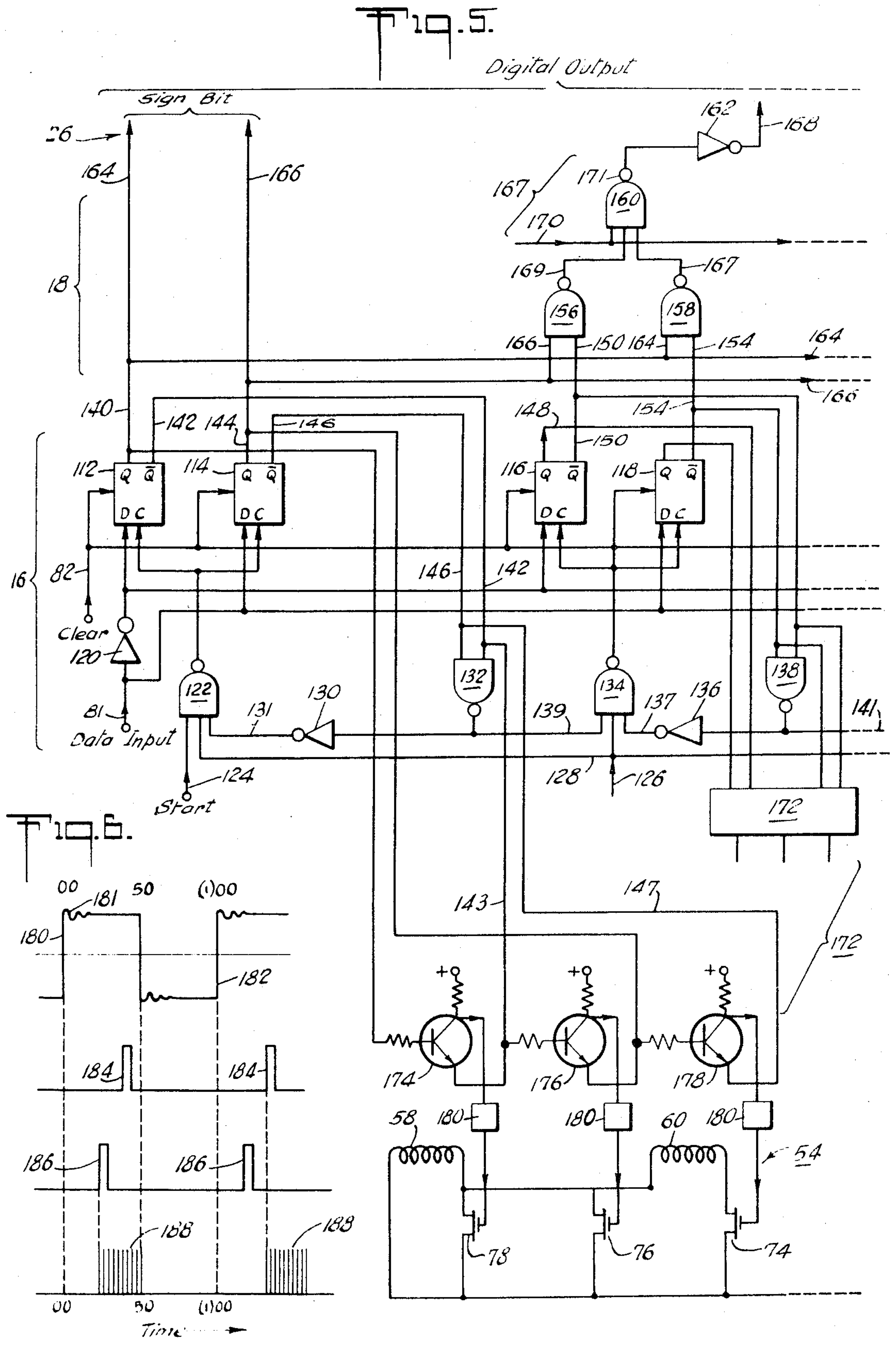
FIG. 5 is a detailed schematic circuit diagram of certain portions of the circuit shown in FIG. 1.
FIG. 6 is a waveform diagram illustrating certain of the operational features of the circuit shown in FIG. 1.

Referring now to FIG. 6, the waveforms 180 and 182 together represent a full cycle of the primary voltage of the transformer. The portion 180 illustrates the primary voltage during the flux-linked sub-cycle of operation, whereas the portion 182 indicates the voltage during the restore sub-cycle of operation. The time base for the waveforms is divided into 100 units. In a typical circuit which has been tested successfully, the total length of time covered by 100 such units (i.e., the length of time for one full cycle of the switching voltage) was 1 millisecond. As will be explained in detail below, secondary voltages for the transformer are sampled only during the latter part of the flux-linked wave 180. The purpose of this is to avoid sampling the wave during the initial portion of the wave during which switching transients 181 may be developed, or during the restore sub-cycle, or during switching between sub-cycles, so as to maintain high accuracy.

Such transients 181 are believed to be primarily the result of resonance between the leakage inductance and distributed capacitance of the transformer.

Referring again to FIG. 1, the transient voltages are minimized in both amplitude and time by a resistor 52 and a capacitor 50 connected in series between the negative input terminal 48 of the differential amplifier 32 and the input lead to the drive winding 28. This is essentially a conventional damping circuit which reduces the duration of the transient voltages created by switching of the primary winding.

The DC input voltage applied to terminals 34 can be any voltage within the voltage ratings of the circuit components. In the exemplary 10-bit converter described above, both windings 28 and 30 preferably have the same number of turns, 1,024, as windings 58 and 60. Thus, the voltage on windings 58 and 60 is equal to the input voltage.

The secondary voltages are not diminished by losses due to current flow through the secondary windings, since the impedance between the gate and the source and drain in the MOSFET devices which are used to switch the primary and secondary windings is very high. Furthermore, the buffer amplifier 80, which preferably is an operational amplifier with very high input impedance, provides further isolation of the secondary windings and prevents the flow of current and resulting voltage drops in those windings.

Figure 7:
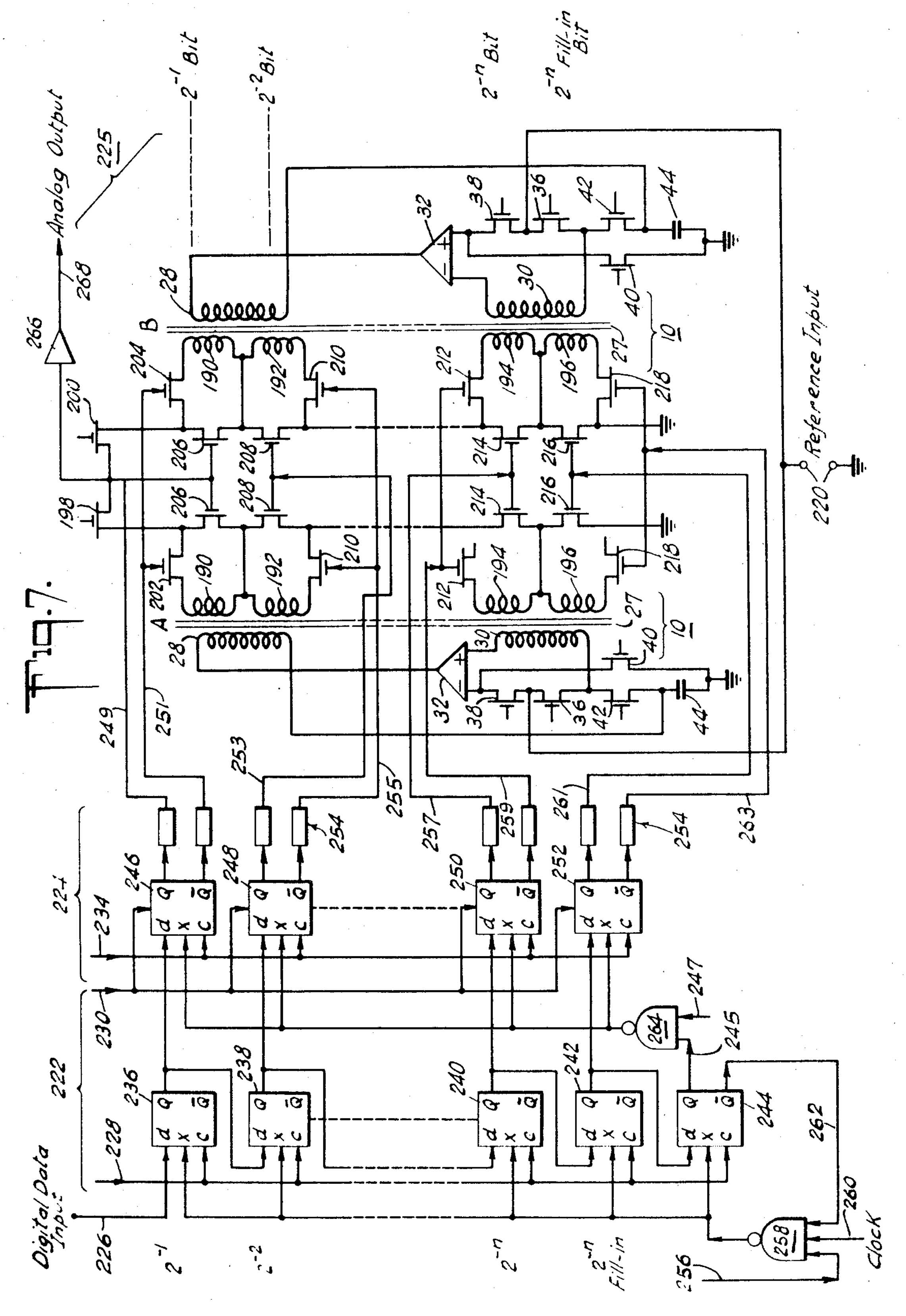
FIG. 7 is a schematic circuit diagram of an alternative embodiment of the present invention.

The transformer shown in FIG. 1 has many advantages. It is capable of producing voltages on the secondary windings which are quite precise multiples of the input voltage. Furthermore, it performs this precise transformation on DC input signals. In another embodiment which is shown in FIG. 7 and will be explained below, the device is capable of operating with both AC and DC input signals with equal facility.

The use of the ratioing device 10 in an analog-to-digital or digital-to-analog converter has further advantages in that the device 10 is inherently much more accurate than circuits such as resistance ladders which have been used in the past. Furthermore, higher accuracy can be obtained at a cost lower than it would be if resistance ladders were used.

TRANSFORMER WINDING AND CORE CONFIGURATIONS

As it will be explained in greater detail below, the preferred form of the core 27 of the transformer of ratioing device 20 is a torus so that windings can be distributed evenly along the magnetic path. A practical difficulty in constructing such a device arises if a large number of secondary windings is required. The reason for this is that the smallest number of turns a secondary winding can have is one turn. If the converter system in which the ratioing device is used has a relatively large number of bits, the winding or windings representing the most significant bit potentially must have an impractically large number of turns. For example, if a system has only 10 bits, and the winding representing the least significant bit has only one turn, the winding representing the most significant bit need have only 1,024 turns, a practical number to wind. However, in an 18-bit system, the most significant winding must have over 250,000 turns, which would be impractical.

In accordance with another figure of the present invention, the foregoing problem is solved by cascading transformers in the manner illustrated in FIG. 4 of the drawings. The arrangement shown in FIG. 4 consists of the toroidal core 27 with its drive winding 28 and sense winding 30, and with 10 pairs of windings 70, 72; 66, 68, etc., with windings 70 and 72 having one turn and windings 58 and 60 having 1,024 turns apiece. A second toroidal core 96 also is provided. The second core 96 has a drive winding 102 which is connected in series with the drive winding 28 of the first core 27. The ratio *r* of the number of turns on the drive winding 28 to the number of turns on the drive winding 102 is a predetermined number. In the specific example being described herein, the ratio *r* is 256; that is, the drive winding 28 has 256 times as many turns as the drive winding 102. With this arrangement, drive current is supplied to the second winding 102 as well as the first winding, but in a manner so as to produce a proportionately lower level of flux in the core 96 than in the core 27.

The second core 96 also has a sense winding 100 which is connected in series with a winding 98 on the core 27. The ratio of turns on winding 100 to the turns on winding 98 is equal to *r*; that is, the turns ratio of winding 100 to winding 98 is the same as the turns ratio of winding to winding 102. The circuit comprising windings 98 and 100 serve to "strap" the two transformer cores together to equalize the drive magnetization to the turns ratio desired. In the specific example here under consideration, winding 28 has 512 turns, and winding 102 has two turns; conversely, winding 100 has 512 turns and winding 98 has two turns. The core 96 has a plurality of secondary windings 108, 110; 104, 106, etc. In the preferred embodiment of the invention here being described, there are eight secondary winding pairs on the core 96 so as to provide for eight bits in addition to the 10 bits provided by the core 27, and to provide an 18-bit ratioing device for extremely accurate analog-to-digital conversion.

The windings 108 and 110 preferably have one turn each. In order to continue the progression of secondary voltages in conformity with the secondary windings on the core 27, each winding 104 and 106 should have 128 turns, thus making the voltage appearing on each such winding one-half the voltage appearing on each winding 70 and 72 on the first transformer. The number of turns on each winding decreases in a binary progression so that the last winding pair 108 and 110 has only one turn and 1/128 of the voltage appearing on the winding 104 or 106.

The foregoing cascading scheme makes it possible to provide a ratioing device effectively having a large number of different secondary windings so as to produce a large number of different binary bits and increase the resolution of the system using the ratioing device without requiring a large number of turns for any single winding. In the example which has been explained, the largest number of turns on any winding is 1,024. Furthermore, the second core 96 need not be of as high quality as the first core 27, and need not add a great amount to the expense of the device. The reason for this is that the second transformer is used only to transform the least significant bits of the total digital signal, and its accuracy therefore need not be as great as that of the core 27.

Figure 9:
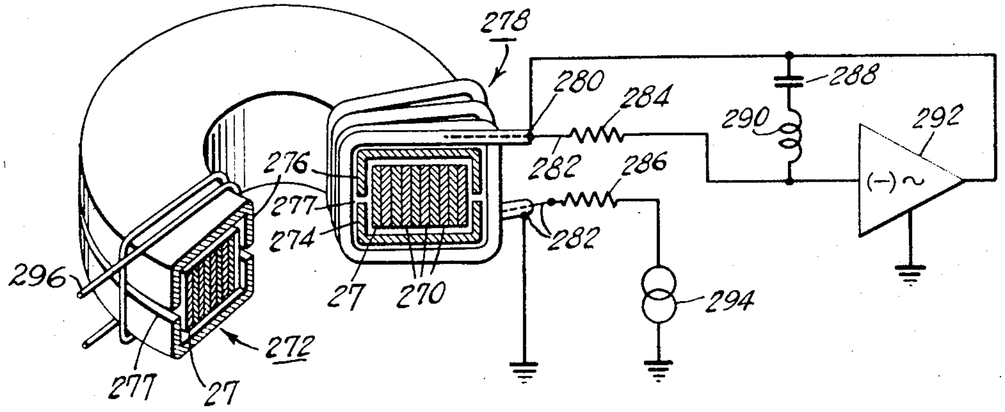
FIGS. 9 and 10 each show another embodiment of the present invention.

FIG. 9 shows the preferred form of the transformer core for the present invention. The core 27 is toroidal in shape, and is formed by winding a spiral of thin strip or "tape" 270 of high-permeability magnetic material to form a torus. A highly desirable material for the core 270 is "supermalloy", which is available from a number of U. S. manufacturers. For example, the supermalloy tape can be 0.002 inch thick.

A conductive aluminum shield 272 surrounds the core 27. The shield 272 is composed of an upper half 276 and a lower half 274 which are separated from one another by a thin air gap 277. Insulation fills the space between the winding core 27 and the shield 272. Insulation, which is not shown, also separates the windings from the shield 272.

In accordance with another feature of the present invention, FIG. 9 illustrates a novel combined drive and sense winding 278. The winding 278 consists of a co-axial cable wound around the core. The co-axial cable includes a shield 280 and a central conductor 282. The shield 280 advantageously is used as the drive winding for the the transformer, and the central conductor 282 is used as the sense winding.

The circuit shown in FIG. 9 is adapted to use only alternating current input signals supplied from an alternating current source 280. Therefore, the switching network described above for use with DC input signals is not required.

The co-axial cable has a uniformly-distributed characteristic impedance $Z_o$. A resistor 284 is connected to one end of the conductor 282, and an equal resistor 286 is connected to the other end of the conductor 282. The resistance of these resistors is equal to the characteristic impedance of the line so that the cable is critically damped within a time period $T_o$, whose value is given approximately by the following equation:

[1] $T_o = 2D/V_o$

In which $D$ is the length of the cable, and $V_o$ is the characteristic propagation velocity of the cable, which typically would be about 0.7 of the free-space velocity of electro-magnetic radiation.

The time $T_o$ represents the time required for transients to propagate the cable when the cable is excited by an input signal, and also is the transient decay time for the cable. Since the time $T_o$ for transients damped by matching resistive terminations can be quite small, the co-axial winding 278 minimizes the time duration of primary and secondary transient voltages compared to transients in random windings of usual forms.

The signals on the shield 280 and the central conductor 282 should be isolated from one another. Accordingly, there is connected between the leads 280 and 282 an isolation circuit consisting of a capacitor 288 and an inductor 290 connected in series. The values for C, the capacitance of capacitor 288, and L, the inductance of inductor 290, are selected so that the isolation circuit appears to be a short circuit to signals having the frequency of cable resonance. The values of L and C are given by the following equations in which $w_o$ is the first-mode resonant frequency of the co-axial line:

[2] $L = Z_o/w_o$

[3] $C = 1/(Z_o w_o)$

[4] $w_o = 1/T_o = V_o/2D$

In practice, the values of L and C will be quite small and the reactance of C will be very high at the signal frequencies contemplated for use in the analog-digital or digital-analog converter circuit of the present invention.

The use of the shield 277 around the core allows secondary winding such as winding 296 shown in FIG. 9 to be distributed along the length of the core 27 asymmetrically. The shield contains flux within the core and ensures that the flux will transverse the necessarily asymmetrically-distributed secondary windings.

Figure 10:
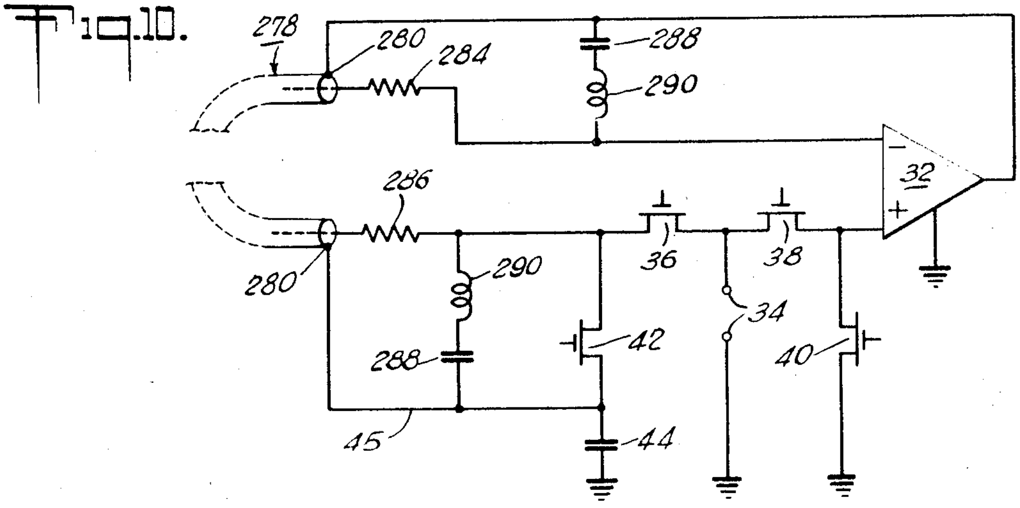

FIG. 10 shows an embodiment of the transformer device of the present invention utilizing the co-axial primary winding structure 278 and core 27 illustrated in greater detail in FIG. 9, together with a primary switching network and differential amplifier 32 which makes the circuit capable of operating with DC input signals. The switching circuit is the same as that shown in FIG. 1 and corresponding parts have the same reference numerals in both figures.

An isolation circuit consisting of the capacitor 288 and the inductor 290 is connected both at the input and the output of the co-axial winding 278. This arrangement provides separation of the drive winding from the sense winding for DC and low frequency AC operation.

It should be understood that the primary winding structure illustrated in FIGS. 9 and 10 can be used with the version of the transformer device which is capable of operating with either AC or DC input signals, and which has yet to be described.

The core 27 and the co-axial winding 278 with terminating impedances 284 and 286 together comprise a transformer which has significant advantages. In effect, the conductor 282 serves as a primary winding, and the shield 280 serves as a secondary winding. The feedback amplifier 32 or 292 is not used, of course, when the transformer is operated in this manner. This transformer has the advantage that it can operate at extremely high repetition rates without significant distortion, because of termination of the conductor 282 with its characteristic impedance.

REGISTER AND WINDING GATING CIRCUITS

FIG. 5 shows in detail a portion of the ternary register 16. The register 16 is called a "ternary" register because each stage has three states "clear", "positive" and "negative", and the positive and negative states comprise a data output in bi-polar binary code.

The register 16 is a stepping register having a plurality of stages, one stage being provided for each bit of output data, plus one stage to indicate the "sign bit" of the output signal. Only two of the stages are shown in FIG. 5, for the sake of clarity in the drawings, but it should be understood that as many stages as desired can be provided, and in a preferred embodiment, the register has 19 stages to provide an 18-bit output signal.

Each stage of the register includes a pair of D-type flip-flops. The first stage comprises flip-flops 112 and 114, and the second stage comprises flip-flops 116 and 118. Preceding each operation of the register 16, a clear signal is supplied over input line 82, and each of the flip-flops in the register is cleared or returned to an initial state in which there is a 1 signal on the right ($\overline{Q}$) lead and an 0 signal on the left (Q) lead of every flip-flop in the register.

The data from the comparator 14 is delivered over lead 81 directly to the data or D input of the second flip-flop 114, 118, etc. in each stage of the register. Simultaneously, the same data is complemented by an inverting amplifier 120 and delivered to the D input of the left or first flip-flop of each stage of the register. Thus, the data from the comparator is delivered directly to the second flip-flop in each stage, and in inverted form to the first flip-flop in each stage of the register.

As is well-known, a D-type flip-flop will not operate unless a clock signal is delivered to the clock input terminal C. A clock signal is supplied periodically to each of the flip-flops in each stage of the register through a NAND gate. In the first stage, the NAND gate has reference numeral 122, and in the second stage the NAND gate has reference numeral 134. Each of the NAND gates 122 and 134 has three input leads and will not supply the clock signal to the corresponding flip-flop pair until it receives simultaneously 1 signals on each of its three leads.

The analog-to-digital converter of the present invention has two separate speeds at which it will operate; normal speed and fast speed. During operation in the normal mode at normal speed a start signal is supplied over input lead 124 to the gate 122 by manual means such as a button or switch which can be operated by a human operator. A timing signal for clocking the register is supplied to the gate 122 over input lead 128 from a line 126 which delivers the signal from the control logic circuit 22 (See FIG. 1). The signal which is delivered over lead 126 is identified by the reference numeral 184 in FIG. 6. Signal 184 is a pulse of relatively short duration which starts 46 milliseconds after the start of the primary voltage pulse 180, and ends 2 milliseconds later. Thus, the signal 184 is timed so that the voltages of the secondary windings of the transformer ratioing device 10 are sampled well after the transients 181 have subsided to a negligible value.

The control logic circuit 22 which develops the signals 184 is not shown in this description since it is conventional. It comprises, for example, two binary-coded decade counters connected in cascade, with the output of the counters connected to appropriate NAND gates and flip-flops in a conventional manner so that an output signal is developed after the two counters have counted 46 pulses of the 100,000 Hertz clock signal, and the output signal is turned off 2 counts later. Such a circuit also provides switching signals to the primary winding gate driver circuit 24 which supplies switching signals over output leads such as leads 92 and 94 (FIG. 1) to the gates to switch them on and off in the cycle described above so as to create the primary voltage waveforms, 180 and 182 shown in FIG. 6.

The third input signal necessary to actuate the gate 122 is supplied over a third input lead 131 through an inverting amplifier 130 and another NAND circuit 132. The input leads to the NAND circuit 132 are connected to the right hand leads 142, 146 of the flip-flops 112, 114.

Each other stage of the register has circuitry similar to that of the first stage. Thus, the second stage has a NAND gate 134 which receives input signals over line 126, over lead 137 from a NAND gate 138 through an inverting amplifier 136, and from the gate 132 of the preceding stage. When each flip-flop is in its cleared condition, there is a 1 signal on each of the right hand leads of the flip-flops in the register. Thus, the output of each of the NAND gates 132 or 138 normally is 0. At this time, all other NAND gates 134, etc. corresponding to the NAND gate 122 will be inhibited because the input lead 139 or 141 which is connected to the output of NAND gate 132 or 138, etc., has a 0 signal on it. Since the output of the inverting amplifiers 130 and 136 initially is 1, when a start signal is supplied over lead 124 and the clock signal 184 is received, the NAND gate 122 will operate to give a clock signal to the flip-flops 112 and 114 and switch them, but no other flip-flops will be switched.

Depending upon whether the input data is 0 or 1 representing a positive or negative polarity to the comparator, either the first or second flip-flop in the first stage switches its output signal from its right terminal to its left terminal. For example, if the first input signal is 1 , then the second flip-flop 114 in the first stage will be actuated. At this point, the NAND gate 132 is utilized as an OR gate. That is, if either of the flip-flop output leads to which the input leads of gate 132 are connected goes to 0, then the output signal from the gate 132 will rise to 1. This 1 signal will simultaneously inhibit the gate 122 through the inverter 130 and enable gate 134, thus allowing the next-timing signal to the register to set the next stage. This procedure is repeated until the register is full at which time a transfer signal shifts the output signal to the decoder 18.

Prior to the enabling of the first stage of the register 16, the signals appearing on leads 142 and 146 of flip-flops 112 and 114 are conducted to a first stage secondary winding gate drive circuit which is indicated generally at 172 in the lower portion of FIG. 5. An identical gate drive circuit 172 is provided for each pair of secondary windings.

Each gate drive circuit 172 includes three transistors 174, 176 and 178. The base lead of the first transistor 174 is connected through a resistor to the left output lead 140 of the first flip-flop 112. The emitter lead of transistor 174 is connected through lead 143 to the right output lead 142 of flip-flop 112, and through a resistor to the base lead of the second transistor 176. The emitter of transistor 176 is connected to the left output lead 144 of the second flip-flop 114 of the first stage of the register, and through a resistor to the base lead of the third transistor 178. The emitter of transistor 178 is connected through a lead 147 to the right output lead 146 of the flip-flop 114.

The collector lead of transistor 174 is connected through a conventional MOSFET coupling circuit 180 to the gate of the MOSFET 78. The coupling circuit 180 typically consists of a resitor and capacitor (not shown) connected in parallel, and that combination connected to the base of a transistor (not shown) whose output is connected to the gate lead of the MOSFET.

The collector of the second transistor 176 is connected through a coupling circuit 180 to the gate lead of the second MOSFET 76 in the first secondary winding group. The collector of the third transistor 178 is connected through a coupling circuit 180 to the gate lead of the third MOSFET 74 of the first secondary winding group.

In the foregoing circuit, when the register 16 is in the cleared condition, with 0 signals on leads 140 and 144 and with 1 signals on leads 142 and 146 of the flip-flops 112 and 114, transistors 174 and 178 are turned off while transistor 176 is turned on because its base lead is connected to a source of positive voltage (1) through the lead 143. Thus, at the beginning of an analog-digital conversion process, all of the gates 76 (See FIG. 1) are on so that there is a complete series connection through the gates 76 in the various secondary winding groups. Thus, referring again to FIG. 1, the analog input signal flows through all of the gates 76, and through the buffer amplifier 80 to the comparator 14 so that the comparator initially senses the true polarity of the input signal with respect to a zero reference voltage.

When the first stage of the register opeates, either transistor 174 or transistor 178 is turned on, depending upon the polarity of the data input signal. In either event, however, the transistor 176 turns off, with the result that either winding 58 or winding 60 is connected between the analog input terminals 12 and the comparator 14 (through the buffer amplifier 80, of course). The reason for this is that if the first flip-flop 112 is the one which is actuated, lead 140 switches to 1 and lead 142 switches to 0. The low voltage (0) on lead 142 causes the base lead of transistor 176 to drop and turns the transistor 176 off. The increase of bias on the base lead of transistor 174 turns it on so that the gate 78 is operated. If, on the other hand, flip-flop 114 is actuated, a 1 signal appears on lead 144, thus turning on transistor 178. The appearance of a signal on a lead 144 positively biases the emitter of transistor 176 and turns it off.

During the operation of the second stage of the register, either flip-flop 116 or flip-flop 118 operates, depending upon the polarity of the new data input signal from the comparator 14. The state of this signal depends, of course, upon whether the voltage of the secondary winding 58 or 60 which has been connected to the analog input voltage is greater or less than the analog input signal. When the next timing pulse 184 is received by the NAND gate 134, either flip-flop 116 or 118 will operate and another gate driver circuit 172 will be operated to switch into the circuit one of the windings 62 or 64 (See FIG. 1).

Each stage of the register is operated in sequence in the same manner, connecting in one or the other of each pair of secondary windings until one winding each of every winding pair is connected. If desired, as noted above, at this time all of the signals can be read out of the register into the decoder 18 by a conventionally-developed read-out signal. Alternatively, each signal can be read into the decoder as it is developed in the register, as is well known in the art.

The normal mode of operation of the register 16 has been described above. When operating in the fast mode, the control logic circuit 22 provides a start signal 186 whose waveform is shown in FIG. 6. This signal 186 starts at 26 milliseconds and ends at 28 milliseconds after the start of the primary waveform 180. After the start signal 186 has been supplied over line 124, the control logic connects the output lead 88 (See FIG. 1) of the clock source 90 directly to the lead 126 so that 100,000 Hertz clock pulses are delivered directly to gates 122, 134, etc. The timing of the pulse 186 is designed so that at least 20 clock pulses 188 (See FIG. 6) will be delivered before the end of the first half cycle 180 of the primary voltage. Thus, the register 16 will step through every stage of its operation within one half cycle of the primary voltage. Since the register steps approximately 50 times faster in the fast mode than in the normal mode, it is expected that the slow mode will be somewhat more accurate than the fast mode. However, where high speed is needed, the fast mode will be most desirable.

DECODER CIRCUIT

FIG. 5 shows two stages of the decoder circuit 18, as well as two stages of the register 16.

The sign bit for the output signal from decoder 18 is provided on terminals 164 and 166 which are connected, respectively, to the left terminals of flip-flops 112 and 114 of the first stage of the register 16. If a 1 appears on lead 164, a 0 appears on lead 166, and vice-versa. If a 1 appears on lead 164, this indicates that the analog input signal was positive in sign, and that a negative correction is required. Therefore, the appearance of a 1 on lead 164 is selected to indicate a positive sign bit. The opposite condition of terminals 164 and 166 indicates a negative sign bit. A logic circuit 167 is provided for each of the other stages of the decoder 18.

Each logic circuit 167 is designed and connected in a manner such that when the sign bit is negative, the data bit from each stage of the register is inverted; that is, the data bit is converted into its complement at the output 168 of the logic circuit 167. When the sign bit is positive, the data bits are not complemented.

Each logic circuit 167 includes three NAND gates 156, 158 and 160. One input lead of gate 156 is connected to the sign bit lead 166, and the other lead is connected to the right output lead 150 of the first flip-flop 116 of the second stage of the register 16. Similarly, one input lead of the gate 158 is connected to the sign bit lead 164, and the other is connected to the right output lead 154 of the second flip-flop 118 in the second register stage. The outputs of gates 156 and 158 are input to a three-input NAND gate 160, together with an optional output blanking signal supplied over a lead 170. THe blanking signal inhibits the gate 160 until it is desired to read the digital output signals from the decoder 18. The output of the NAND gate 160 flows through an inverting amplifier 162 to the output terminal 168.

THe sign bit signals are delivered over leads 164 and 166 to succeeding logic circuits 167 for each of the succeeding stages of the decoder. Similarly, the blanking signal is delivered over line 170 to each succeeding stage.

The operation of logic circuit 167 is more fully explained in the following table:

TABLE 1: TRUTH TABLE FOR DECODER 18

| DATA SIGN | SIGN BIT | SIGNAL ON LEAD NO: 164 | 166 | 150 | 154 | 167 | 169 | 170 | 171 | 168 |
|---|---|---|---|---|---|---|---|---|---|---|
| + | + | + | 0 | + | 0 | + | + | + | 0 | 1 |
| − | + | + | 0 | 0 | + | 0 | + | + | + | 0 |
| + | − | 0 | + | + | 0 | + | 0 | + | + | 0 |
| − | − | 0 | + | 0 | + | + | + | + | + | 1 |

In Table 1, a plus sign in a particular column means there is a positive (1) voltage on a lead, and a zero means there is no voltage (0) on the lead. The output signal on the lead 168 is expressed in binary terminology.

DIGITAL-TO-ANALOG CONVERTER — GENERAL DESCRIPTION

FIG. 7 illustrates a digital-to-analog converter (hereinafter referred to as a "D/A converter"). DIgital data, preferably in the form of binary-coded data, is fed into the converter through an input lead 226 which is shown in the upper left portoin of FIG. 7. An analog output signal which represents the digital input signal is supplied over output lead 268, which is shown in the upper right hand portion of FIG. 7.

The digital data is received in a storage register 222. The data signal includes a "lead" bit at the beginning, and, following the lead bit, a "fill-in" bit which is provided for purposes to be described below. When the resister 222 is full, the stored signal is transferred to a latching circuit 224 by application of a clock pulse to line 247. The signals are transferred from the latching circuit 224 to a ratioing circuit which is indicated generally at 225. The ratioing circuit 225 includes two ratioing devices 10 of the same type as that shown in FIG. 1, one being designated by the latter A and the other by the letter B. Each of th devices 10 has a plurality of secondary windings, the number of turns on each winding varying in accordance with a binary progression. The signals from latching circuit 224 control a switching network which connects the secondary windings of each circuit 10 in a certain sequence, and alternately samples one of the ratioing devices A or B to produce the analog output signal.

STORAGE REGISTER AND LATCHING CIRCUIT

The storage register 222 is of a conventional type comprising a series of D-type flip-flops 236, 238, 240, 242 and 244. Only five such flip-flops are shown in FIG. 7, but it should be understood that as many flip-flops as there are bits of input data will be provided. Clock pulses are supplied to an enabling NAND gate 258, together with a date-entering signal from a line 256, and another enabling signal from the lead flip-flop 244 over line 262. As the register steps, the data transfers from one flip-flop to the next until finally the lead bit (which always is a 1) reaches the flip-flop 244 and shifts that flip-flop, thus turning off the NAND gate 258 and sending an enabling signal over lead 245 to a NAND gate 264. When a transfer command signal is supplied to the gate 264 over a second input lead 247, the signals stored in the register 222 are transferred to the latching circuit 224.

A clock signal is supplied by the NAND gate 264 to each of a series of D-type flip-flops 246, 248, 250 and 252, there being one such flip-flop for each flip-flop in the register 222 except for the lead flip-flop 244. The clock signal supplied to the flip-flops in the latching circuit 224 enables transfer of the stored signals from the register 222.

The register 222 is cleared by means of a clear signal supplied on a lead 228 in order to prepare the register for the next incoming input signal. A special-purpose input lead 234 is provided in order to set each of the flip-flops in the latching circuit 224 to 0, and a second special-purpose input lead 230 is provided to set all the flip-flops to 1. These settings of the latching circuit are desirable when the digital-analog converter is used in coefficient-setting in analog and hybrid computers. Setting all of the latching circuit flip-flops to either 1 or 0 will respectively provide either zero or unity analog output signal without full data input.

A MOSFET driver circuit 254 is connected to each output lead of each flip-flop in the latching circuit. Circuit 254 is conventional and is similar to the circuit 180 which is used to drive the MOSFETS shown in FIG. 1.

Each of the transformer ratio devices 10 in the ratioing circuit 225 has a plurality of secondary windings 190, 192, 194 and 196. Although only four such windings are shown, there are as many secondary windings on each core as there are data bits to be converted. The number of turns on each winding varies in accordance with a binary progression in which the most significant winding is winding 190 whose weight is $2^{-1}$, and the least significant is winding 194 with a weight $2^{-n}$, where n is the number of data bits to be converted. The fill-in winding 196 has the same number of turns as the winding 194, and is provided in order to fill in the bit which otherwise would be missing from the analog representation of a digital input signal. The following example will assist in the understanding of this point.

Assume the input data has 7 bits. There will be eight secondary windings on each of the cores. The relative number of turns and, hence, the relative voltages of the first seven windings are indicated by the following binary progression:

64, 32, 16, 8, 4, 2, 1

The sum of the foregoing numbers is only 127, which is one short of the desired total of 128. The addition of the fill-in bit relieves this shortage. The fill-in bit always is 0 except when the input word calls for unity ratio, or 128.

Connected in parallel with each of the windings is a MOSFET device 206, 208, 214 or 216. Connected in series with each winding is another MOSFET 202, 210, 212, 218. The output leads from the driver circuits 254 are connected so that the first output leads 249, 253, 257, 259 and 261 all are connected to a pair of the parallel MOSFETS 206, 208, 214 or 216, whereas the complementary output leads 251, 255, 259 and 263 are connected to a pair of series MOSFETS 202, 210, 212 or 218. When one of the parallel gates 206, 208, etc. is energized, the winding which is connected in parallel with that gate is bypasses so that its voltage is not added to the total analog output voltage. However, if a series gate such as gate 202 is energized, the winding to which the gate is connected will be connected in series and will add its voltage to the analog output. Thus, the secondary voltages are added together selectively to form an analog representation by the digital input signal.

The uses of the digital-to-analog converter shown in FIG. 7 are many. However, it is believed that this circuit is particularly useful in digitally setting the coefficients for analog computation in analog and hybrid computers. The precision with which the analog signal is provided is believed to be superior to the precision of other approaches such as the use of a resistive potentiometer driven by a servo-motor, or switched resistance ladders to provide such coefficients.

A/C-D/C TRANSFORMER DEVICE

The ratioing device 225 comprises, in essence, a transformer which is capable of operating with either AC or DC input signals to provide secondary winding voltages which are precise multiples of the primary input signals. An input voltage is applied to a pair of input terminals 220. For the purposes of the digital-to-analog converter shown in FIG. 7, the voltage applied at terminals 220 is a reference voltage. This signal is supplied to each of the two circuits A and B.

A pair of MOSFET gates 198 and 200 is used to alternately sample either the A or the B transformer winding secondaries. The primary voltages for the two transformers 10 also are switched in accordance with a predetermined schedule. A preferred example of a schedule for switching the primary and secondary voltages in the ratioing device 225 is illustrated by the chart in FIG. 8. By means of control logic such as that described above for use in the control logic device 22, the A primary circuit is gated on at a count of 90 and off at a count of 52 and on again at 90, etc., and the A secondary is turned on at a count of 99 and off at a count of 51, just slightly before the primary is turned off. The B primary is turned on at the count of 40, somewhat before the A primary is turned off, and the B primary is turned off at a count of 2, somewhat after the A primary is turned on. Thus, there is considerable overlap of the on cycles for the A and B primary voltages. The B secondary voltage is turned on at a count of 49, just prior to the turning off of the A secondary, and is turned off at a count of 1, just slightly after the A secondary turns on. Thus, there is an overlap of 2 counts in the secondary voltage turn-off and turn-on times so that there always is a secondary voltage for the circuit 225 to sense. The differences between the times at which the primary and secondary voltages are turned on in each half of the circuit is the settling time for the circuit in which the transients are allowed to settle before the secondary voltages are switched in.

Figure 8:
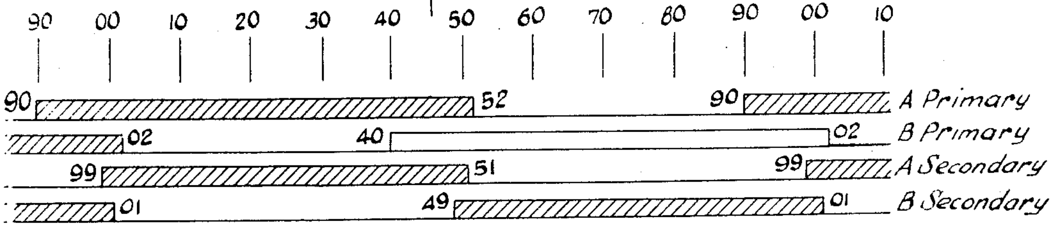
FIG. 8 is a waveform diagram explaining certain of the operational parameters of the circuit shown in FIG. 7.

As it can be seen from FIG. 8, the primary voltages are on for much longer times than they are off. This asymmetric switching is provided in order to allow as much settling time as possible so as to maximize the accuracy of the transformer device. Because of this asymmetrical switching, the feedback capacitor 44 in each half of the circuit 225 generally will charge to a fixed DC value, and then the peak value of the voltage on the capacitor will vary upwardly and downwardly over a narrow range above and below the steady state value of the voltage. Thus, the circuit automatically compensates for the change in the flux level in the cores 27 which would be caused by the asymmetric switching but for the use of the feedback capacitor.

Whereas the ratioing circuit 10 shown in FIG. 1 is capable of operating with DC input signals, and the circuit shown in FIG. 9 is capable of operating with AC input signals, the circuit 225 shown in FIG. 7 is capable of operating with AC input signals having a wide range of frequencies, as well as with DC input signals. All such signals are converted into precisely proportioned secondary voltages, without low-frequency roll-off that would be characteristic of prior equipment.

The above description of the invention is intended to be illustrative and not limiting. Various changes or modifications in the embodiments described may occur to those skilled in the art and these can be made without departing from the spirit or scope of the invention.

I claim:

1. A device for converting input signals between analog form and digital form, said device comprising, in combination, a transformer, said transformer having a core, a primary winding and a plurality of secondary windings, the numbers of turns on said secondary windings varying in accordance with a digital code, and means responsive to input signals in one of said forms for combining the voltages of said secondary windings to provide a corresponding output signal in the other of said forms.

2. A device as in claim 1 in which said primary winding has a pair of input terminals, means for repeatedly reversing the connection of said input terminals to said primary winding, and flux-limiting means for maintaining the magnetic flux in said core at a level below that which causes saturation of said core.

3. A device as in claim 1 in which said primary winding has a pair of input terminals, means for repeatedly reversing the connection of said input terminals to said primary winding, a drive winding on said core, a high-gain amplifier supplying drive current for said transformer to said drive winding, means for feeding back a current-indicating signal from said drive winding to the input of said amplifier, said input terminals and said primary winding being connected to the input of said amplifier, so that the feedback provided by said feedback winding maintains the voltage across said primary winding at approximately the input voltage to said device, and flux-limiting means for maintaining the magnetic flux in said core at a level below that which causes saturation of said core.

4. A device as in claim 3 in which said flux-limiting means comprises storage means for storing a signal representative of the magnetization current through said drive winding during one portion of the cycle of input terminal reversals, and for applying said signal to the input of said amplifier during the other portion of said cycle.

5. A device including two devices as claimed in claim 2, and means for synchronizing the reversal of the input terminal connections in the two transformers so that the input terminal connections in the two transformers are maintained in a substantially opposite condition.

6. A device as in claim 1 in which said combining means includes a plurality of field effect transistor (FET) switches operable to selectively connect said windings together in series with one another, and gating means for selectively gating said FET switches.

7. A device as in claim 1 in which said secondary windings include a plurality of pairs of oppositely-wound windings having equal numbers of turns, said combining means including means for selecting only one of each pair of windings and connecting it in circuit with one of each other pair of windings to combine the voltages on said windings.

8. A device as in claim 7 in which said combining means includes a plurality of groups of field effect transistor (FET) switches, one group for each winding pair, and gating means for selectively gating the switches in said groups.

9. A device as in claim 8 in which the windings in each pair have one terminal connected to one terminal of the other winding at a junction, said group of FET switches including a first FET with one end of its channel connected to the other terminal of one of said windings and a second FET with one end of its channel connected to the other terminal of the other of said windings, and means for connecting the other end of each channel to the other FET switches.

10. A device as in claim 9 including, in each group, a third FET whose channel is connected between said junction and said other ends of the other two FET's.

11. A device as in claim 1 including a second core with a plurality of secondary windings; series-connected coupling windings, one on each core, the coupling winding on the first-named core having a proportionally smaller number of turns than said coupling winding on said second core, the secondary windings on said second core providing the least significant bits of the digital-form signal, and the secondary windings on said first core providing the most significant bits.

12. A device as in claim 11 including first and second series-connected primary windings, the first primary winding being on said first core and the second primary winding being on said second core, the ratio of the number of turns of said first primary winding to the number of turns of said second primary winding being the inverse of the ratio of turns of said first coupling winding to that of said second coupling winding.

13. A device as in claim 6 in which said FET switches are MOS FET switches.

14. A digital-to-analog converter comprising, in combination, a transformer, said transformer having a primary winding and a plurality of secondary windings, the numbers of turns on said secondary windings varying in accordance with a digital code, means responsive to an input signal in digital form for combining the voltages of said secondary windings to form a composite analog signal whose magnitude represents the value of said input signal.

15. A converter as in claim 14 in which each bit of said digital input signal corresponds to and controls the combination of one of said secondary windings.

16. A converter as in claim 14 in which said primary winding has a pair of input terminals, means for repeatedly reversing the connection of said input terminals to said primary winding, and flux-limiting means for maintaining the magnetic flux in said core at a level below that which causes saturation of said core.

17. A converter as in claim 14 in which said combining means includes separate means for selectively connecting each of said secondary windings in series with at least one other secondary winding in response to the receipt of one bit of said digital input signal.

18. A converter including two converters as claimed in claim 16, and means for synchronizing the reversal of the input terminal connections in the two transformers so that the input terminal connections in the two transformers are maintained in a substantially opposite condition, and means for supplying a common input signal to both sets of input terminals, and for providing oppositely-synchronized sampling of the signals on the secondary windings of said transformers.

19. A converter as in claim 14 in which said code is binary, and in which the number of secondary windings which is combined is equal to the number of bits in said input signal plus one, the extra winding having the same number of turns as the winding corresponding to the least significant bit of the input signal, and means for including said extra winding in each secondary winding combination.

20. A converter as in claim 19 in which said combining means adds the voltages on said secondary windings, each voltage being added in accordance with one bit of the input signal.

21. An analog-to-digital conversion method comprising the steps of comparing an analog input signal with a reference signal, detecting the polarity of the difference between said input signal and said reference signal, adding a corrective signal to said reference signal with a polarity opposite to the polarity of said difference, developing a digital output signal corresponding to said corrective signal, and repeating said comparing, detecting adding and developing steps a plurality of times, with the magnitude of the corrective signal decreasing each time in accordance with a digital code progression.

22. A method as in claim 21 in which said output signal indicates the polarity of the difference between said input and reference signals after said corrective signal has been added.

23. A method as in claim 21 in which the initial value of said reference signal is zero, and including the step of developing a sign bit output signal corresponding to the polarity of the difference between said input signal and zero.

24. A method as in claim 22 including the step of converting said output to one of two binary signals, one of said binary signals corresponding to one polarity, and the other corresponding to the other polarity.

25. A method as in claim 24, and including the step of using said sign bit signal to complement the other output signals.

26. In an analog-to-digital converter, means for comparing an analog input signal with a reference signal and developing an error signal having a polarity determined by the polarity of th difference between said input signal and said reference signal, means for combining sequentially with said reference signal each of a plurality of corrective signals, each of said corrective signals having a polarity opposite to the polarity of said difference at the time said corrective signal is combined with said reference signal, the magnitudes of said corrective signals forming a progression in accordance with a digital code.

27. Apparatus as in claim 26 including ternary register means connected to said comparing means, and decoding means for converting the output of said ternary register means into binary code.

28. Apparatus as in claim 26 including a ladder network which constitutes a source of said corrective signals, and means for switching each element of said ladder network into circuit with the aforementioned polarity.

29. Apparatus as in claim 21 including means for developing a plurality of polarized digital signals, each representing the polarity of one of said corrective signals, and decoding means for converting said polarized digital signals into a binary form, one polarity of each such polarized signal representing a binary "one", and the other polarity representing a binary "zero".

30. Apparatus as in claim 26 in which said reference signal initially is zero, and sign bit means for indicating the polarity of said input signal with respect to zero.

31. Apparatus as in claim 29 in which said reference signal initially is zero, and sign bit means for indicating the polarity of said input signal with respect to zero, and means for using said sign bit means for complementing said binary output signals.

32. Apparatus as in claim 28 in which said ladder network includes a plurality of secondary windings wound on a transformer core, a primary winding on said core, a pair of input terminals for said primary winding, means for repeatedly reversing the connection of said input terminals to said primary winding, and flux-limiting means for maintaining the magnetic flux in said core at a level below that which causes saturation of said core.

33. An analog-to-digital conversion method comprising the steps of detecting the polarity of an analog input signal, developing a sign bit binary output signal, performing a successive approximation conversion of said analog signal to binary digital form, and complementing the digital-form signal in accordance with the sign bit signal.

34. An analog-to-digital converter, said converter comprising, in combination, a transformer, said transformer having a core, a primary winding and a plurality of secondary windings, the numbers of turns on said secondary windings varying in accordance with a digital code, and means responsive to input signals in analog form for combining the voltages of said secondary windings to provide a corresponding digital output signal.

35. A converter as in claim 34 in which said primary winding has a pair of input terminals, means for repeatedly reversing the connection of said input terminals to said primary winding, and flux-limiting means for maintaining the magnetic flux in said core at a level below that which causes saturation of said core.

36. A converter as in claim 35, in which said combining means includes separate means for selectively connecting each of said secondary windings in series with at least one other secondary winding, including a comparator for comparing the total output of the combined secondary windings with an analog input signal, and means for providing each of a plurality of digital output signal bits in response to the combining of each of said secondary winding voltages.

37. A converter as in claim 34 including a pair of input terminals for said primary winding, means for repeatedly reversing the connection of said input terminals to said primary winding, a drive winding on said core, a high-gain amplifier supplying drive current for said transformer to said drive winding, means for feeding back a current-indicating signal from said drive winding to the input of said amplifier, said input-terminals and said primary winding being connected to the input of said amplifier so that the feedback provided by said drive winding maintains the voltage across said primary winding at approximately the input voltage to said device.

38. A converter as in claim 37 in which said flux-limiting means comprises storage means for storing a signal representative of the magnetization current through said drive winding during one portion of the cycle of input terminal reversals, and for applying said signal to the input of said amplifier during the other portion of said cycle.

* * * * *

UNITED STATES PATENT OFFICE
CERTIFICATE OF CORRECTION

Patent No. 3,745,557 Dated July 10, 1973

Inventor(s) ROSWELL W. GILBERT

It is certified that error appears in the above-identified patent and that said Letters Patent are hereby corrected as shown below:

Column 17, lines 21 and 22, (Claim 3, lines 10 and 11) delete "feed-back" and substitute --drive--.

Signed and sealed this 27th day of November 1973.

(SEAL)
Attest:

EDWARD M.FLETCHER,JR.
Attesting Officer

RENE D. TEGTMEYER
Acting Commissioner of Patents